(12) United States Patent
Crouch et al.

(10) Patent No.: US 7,812,263 B2
(45) Date of Patent: Oct. 12, 2010

(54) COMBINED ENVIRONMENTAL-ELECTROMAGNETIC ROTARY SEAL

(75) Inventors: David Crouch, Corona, CA (US);
Vincent Giancola, Chino, CA (US);
Kenneth W. Brown, Yucaipa, CA (US)

(73) Assignee: Raytheon Company, Waltham, MA (US)

( * ) Notice: Subject to any disclaimer, the term of this patent is extended or adjusted under 35 U.S.C. 154(b) by 484 days.

(21) Appl. No.: 11/732,734

(22) Filed: Apr. 4, 2007

(65) Prior Publication Data
US 2008/0245560 A1 Oct. 9, 2008

(51) Int. Cl.
*H05K 9/00* (2006.01)
(52) U.S. Cl. .......................... 174/368; 174/377; 174/382
(58) Field of Classification Search .................. 174/351, 174/358, 367, 368, 377, 382; 361/816, 818
See application file for complete search history.

(56) References Cited
U.S. PATENT DOCUMENTS
4,701,726 A * 10/1987 Holdsworth ................ 333/185
2002/0157843 A1* 10/2002 Fukushima et al. ........ 174/35 R

* cited by examiner

*Primary Examiner*—Hung V Ngo
(74) *Attorney, Agent, or Firm*—John Horn, Esq.

(57) ABSTRACT

A combined environmental and electromagnetic rotary seal. The invention is adapted for use between two mutually rotating components of an electromagnetic energy transmission system and provides simultaneous protection against contamination from the environment and unwanted electromagnetic leakage. In the illustrative embodiment, a first set of grooves is cut into the exterior of a first conductive cylindrical component whose interior contains a portion of a millimeter-wave beam waveguide energy transmission system, the grooves comprising the electromagnetic portion of the seal and a second set of grooves is cut into the interior of the conductive housing enclosing the first conductive cylindrical component. The second set of grooves comprises the environmental portion of the seal when a set of standard environmental seals (such as elastomeric o-ring seals) are seated in each groove in the second set of grooves and each seal is compressed between the groove in which it is seated and the exterior of the first conductive cylindrical component. The environmental seals maintain a nearly uniform annular gap between the first conductive cylindrical component and the conductive housing such that the two conductors do not make physical contact.

7 Claims, 5 Drawing Sheets

COMBINED ENVIRONMENTAL-ELECTROMAGNETIC ROTARY SEAL

BACKGROUND OF THE INVENTION

1. Field of the Invention

The invention relates to environmental and electromagnetic seals for rotary junctions. More specifically, this invention relates to combined environmental and electromagnetic rotary seals for electromagnetic energy transmission systems.

2. Description of the Related Art

For certain applications, it is necessary or desirable to provide an environmental as well as an electromagnetic seal. For example, in the field of directed energy, one system might involve transmission of a high-power millimeter wave beam. Due to the high power levels of these systems, seals are required to prevent leakage of electromagnetic energy. Such leakage can be deleterious to associated electronic devices and systems and personnel. The need for seals is exacerbated by the need for rotary joints to assist in the direction of energy. These joints must be sealed environmentally as well as electromagnetically.

Environmental seals serve to protect the joint against the introduction of dirt and debris which might adversely impact the performance of the host system and/or the electromagnetic seals.

Electromagnetic seals have a long history of usage in RF, microwave, and millimeter-wave systems. For example, a choke flange is an electromagnetic seal used with conventional waveguide to prevent leakage of electromagnetic energy from the junction between adjacent sections of waveguide into the environment. A choke flange prevents the passage of electromagnetic energy by presenting a discontinuity to incident electromagnetic fields, thereby reflecting them back in the direction from which they came. The discontinuity usually takes the form of one or more grooves cut into the face of the flange. A choke flange is an electromagnetic seal only. A separate environmental seal is required if contamination of the waveguide interior is to be prevented.

Gaskets are frequently used to provide environmental and/or electromagnetic seals. Non-conductive gaskets are largely transparent to incident electromagnetic radiation and thus provide an environmental seal only. Combined environmental-electromagnetic gaskets are available, but are expensive and fragile. Such gaskets work well when used to provide a seal between stationary components, e.g., between two waveguide flanges. When used as a seal between two components that can move with respect to one another, such gaskets are prone to wear due to friction.

Unlike standard environmental gaskets such as elastomeric o-rings whose performance is not degraded by lubrication, combination environmental-electromagnetic gaskets cannot be lubricated without at the same time seriously degrading their electrical performance. Due to their brittleness, they are damaged easily when handled or used in rotary applications and require frequent replacement. Moreover, combined environmental-electromagnetic gaskets of this type are prone to generating small free metal particles as they wear. This is problematic inasmuch as the presence of conductive particles in a high-power beam waveguide system can cause arcs that can degrade the beam transport path and/or damage expensive equipment.

Hence, a need exists in the art for an improved low-cost combined environmental-electromagnetic rotary seal for electromagnetic energy transmission systems.

SUMMARY OF THE INVENTION

The need in the art is addressed by the combined environmental and electromagnetic rotary seal of the present invention. In the illustrative implementation, the electromagnetic seal comprises a surface of conductive material and one or more grooves in the tube designed to operate as a transmission line at a predetermined frequency. In the best mode, the transmission line provided by the grooves is designed to have high impedance at the predetermined frequency such that it has a transfer function approaching zero.

In the illustrative embodiment the surface is provided on a tube. When combined with an environmental seal, the present teachings provide an improved rotary seal. The environmental seal includes a gasket disposed in a groove between the tube and a fitting therefor. The grooves comprising the electromagnetic seal vary in width, depth, and/or separation.

The teachings disclosed herein also provide a method of designing a combined environmental-electromagnetic beam waveguide rotary seal, comprising the steps of: selecting the number, width, depth, and separation of the grooves comprising the electromagnetic seal to approximate the desired level of attenuation over a desired operating frequency range, including the steps of choosing the number, width, depth, and separation of the grooves comprising the electromagnetic seal; optimizing one or more of the selected dimensions of the grooves comprising the electromagnetic seal to closely approximate the desired attenuation as a function of frequency; and selecting the number, width, depth, and separation of the grooves comprising the environmental seal.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto.

Those having ordinary skill in the art and access to the teachings provided herein will recognize additional modifications, applications, and embodiments within the scope thereof and additional fields in which the present invention would be of significant utility.

Figure 1:
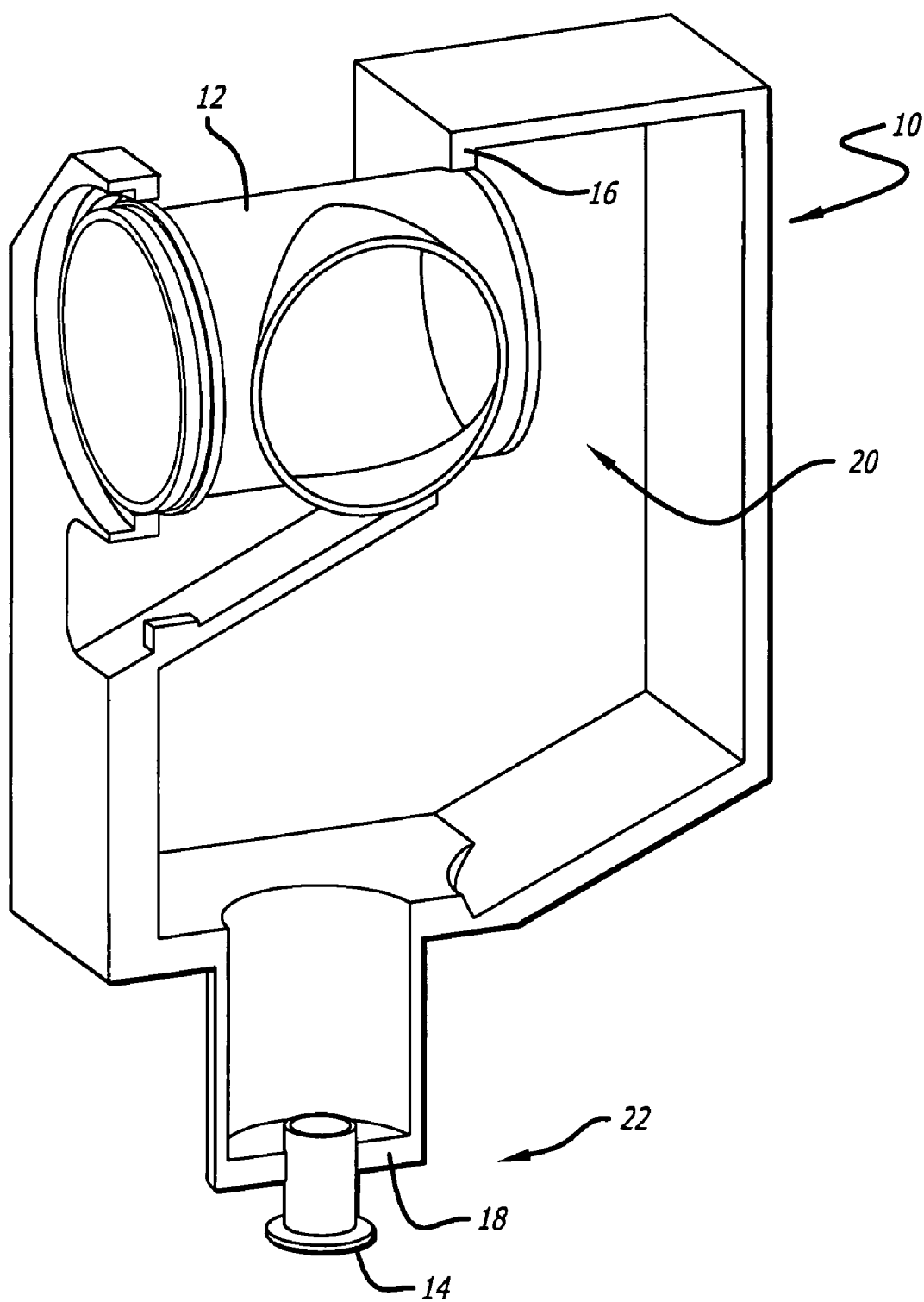
FIG. 1 is a view, partially in section, of a portion of a beam waveguide system incorporating two combined environmental-electromagnetic rotary seals in accordance with an illustrative embodiment of the present teachings.

FIG. 1 is a view, partially in section, of a portion of a beam waveguide system incorporating two combined environmental-electromagnetic rotary seals in accordance with an illustrative embodiment of the present teachings. As shown in FIG. 1, in the illustrative embodiment, the invention is adapted for use with a housing 10 that includes first and second conductive cylindrical tubes 12 and 14. The housing 10 may enclose an electronic system such as a directed energy millimeter wave system or other apparatus. The housing is fabricated in an aluminum alloy or other suitable material. The interior of each tube is a component of a beam waveguide electromagnetic energy transmission system. In other embodiments, however, the cylinder may enclose waveguide or coaxial transmission lines.

In the illustrative embodiment, each cylindrical tube 12 and 14 is conductive and is retained by a conductive cylindrical fitting 16 and 18 respectively. The tubes and fittings may be fabricated in an aluminum alloy or other suitable material. The interior of the housing 10 is the volume to be sealed against environmental and electromagnetic leakage. Each tube 12, 14 rotates freely about its longitudinal axis with respect to the associated fitting. A first seal arrangement 20 is provided at the end of the first tube 12 and a second seal arrangement 22 is provided at the end of the second tube 14.

Figure 2A:
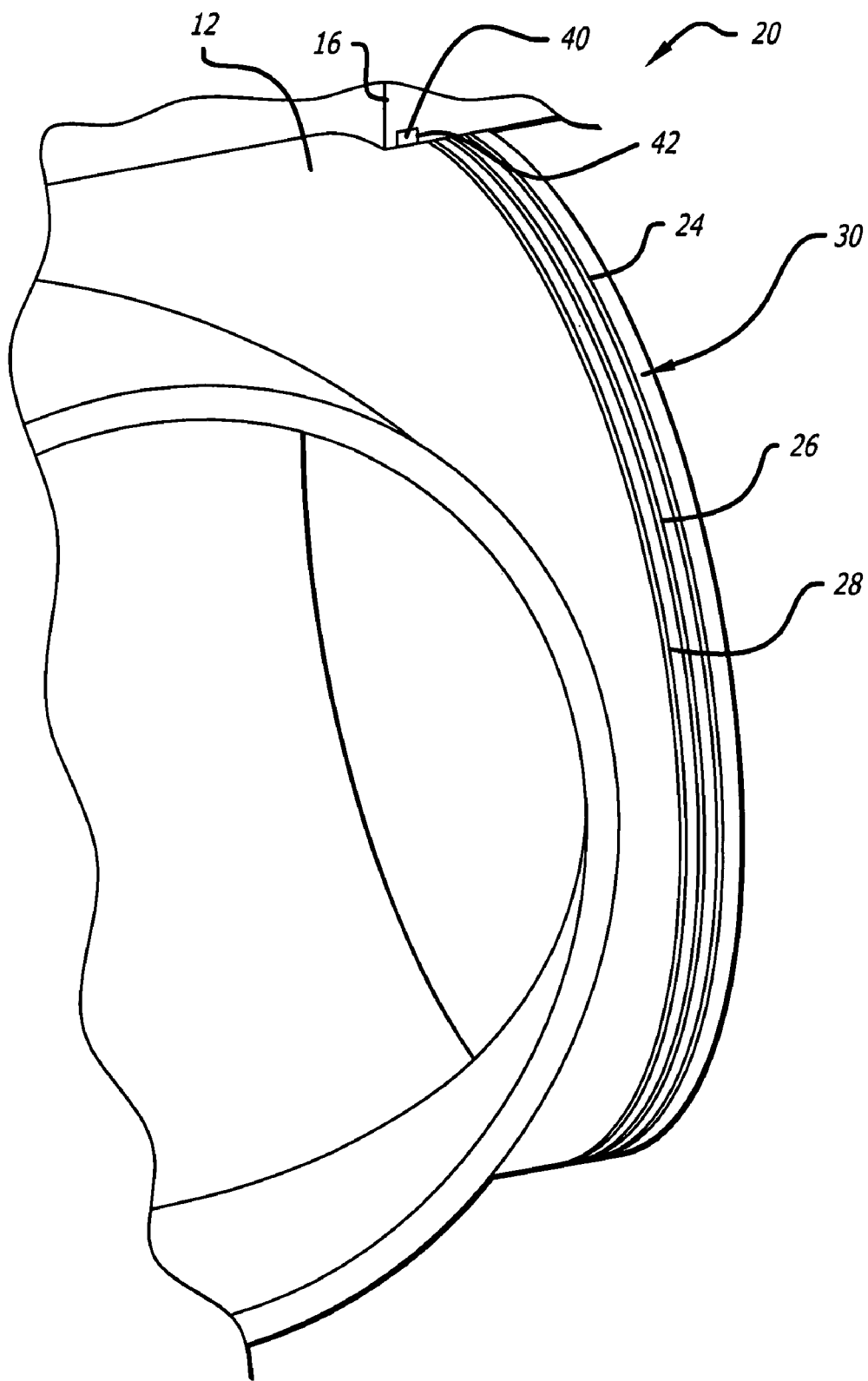
FIG. 2a is a magnified view, partially in section, of the first of two combined environmental-electromagnetic rotary seals shown in FIG. 1.
Figure 2B:
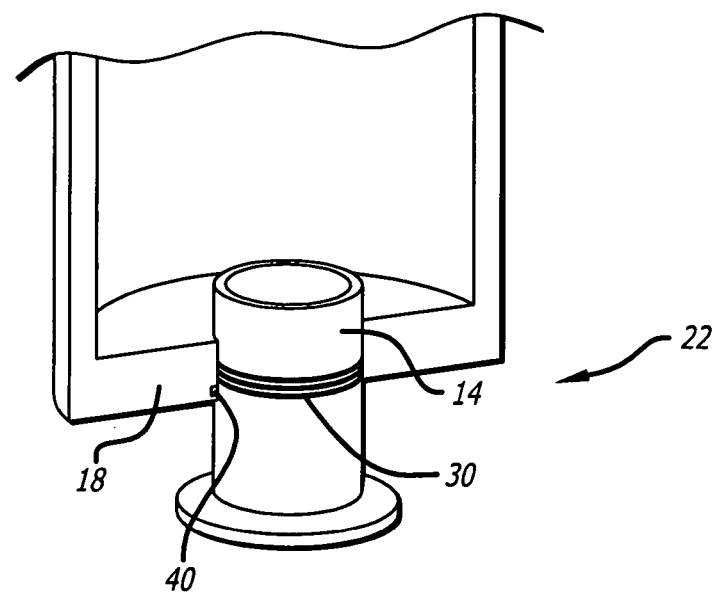
FIG. 2b is a magnified view, partially in section, of the second of two combined environmental-electromagnetic rotary seals shown in FIG. 1.

FIG. 2a is a magnified view, partially in section, of the first of two combined environmental-electromagnetic rotary seals shown in FIG. 1. FIG. 2b is a magnified view, partially in section, of the second of two combined environmental-electromagnetic rotary seals shown in FIG. 1. In accordance with the present teachings, each seal arrangement 20, 22 includes an electromagnetic seal 30 and an environmental seal 40. The electromagnetic seal 30 is implemented with a set of circumferential grooves 24, 26, and 28. The three grooves 24, 26, 28 are cut into the exterior surface of each cylindrical tube over the portion of the tube lying inside the fitting to provide an electromagnetic radio-frequency (RF) seal. As discussed more fully below, the width, depth, number and distribution of grooves 24, 26, and 28 are chosen to minimize the passage of electromagnetic energy over the transmission path formed by, the gap between the exterior of the cylindrical tube and the fitting.

A second set of grooves 42 and 44 is cut into each fitting 16, 18 of the housing 10. Each groove in the second set accommodates an environmental gasket 46 (not shown). The environmental gasket is of conventional design and construction. That is, the environmental gasket 46 may be fabricated with an elastomeric o-ring or other material without departing from the scope of the present teachings. The gasket 46 maintains a nearly uniform annular gap between the exterior surface of the cylindrical tube and the fitting and prevents the tube and fitting from coming into physical contact. This assures adequate insulation between the two components. This allows the two conductors to be maintained at separate electrical potentials, subject to the electrical limitations imposed by the gap size and the dielectric strength of the gasket material.

The locations of the grooves 40 of the environmental seals are chosen to avoid overlap with the grooves 24, 26, and 28 of the electromagnetic seals and to prevent passage of particulate matter from outside the housing 10. To prevent the collection of particulate matter in the grooves of the electromagnetic seals, the environmental gaskets are located between the electromagnetic seals and the ambient environment. That is, in both seal arrangements 20 and 22, the environmental seal 40 is placed between the environment from which the sealed enclosure is to be protected and the electromagnetic seal 30 to prevent the build-up of moisture, dirt, and debris in the small choke grooves which, if allowed to accumulate, could degrade the performance of the electromagnetic seal. In the best mode, the gasket is lubricated to facilitate free rotation of the conductive tube with respect to the conductive fitting.

As mentioned above, with the environmental gasket 46 in place, a gap or series of gaps exists between the tubes and the fittings therefor. At millimeter-wave frequencies, each gap will tend to be many wavelengths in length and can therefore support the propagation of electromagnetic waves between each conductive cylindrical tube and the associated conductive fitting.

As mentioned above, the width, depth, number, and the distribution of the grooves are all chosen to minimize the passage of electromagnetic energy at the desired frequency of operation.

In the embodiment illustrated in FIGS. 1 and 2, the radius of curvature of the conductive cylindrical component into which the grooves that comprise the electromagnetic seal are cut is large compared to a wavelength at millimeter-wave frequencies. Hence, for purposes of electrical design, at millimeter wave frequencies, the gap between the conductive cylindrical component and the conductive housing can be treated as a parallel-plate transmission line. Hence, a parallel-plate transmission line model forms a compact foundation for an implementation of an electromagnetic seal in accordance with the present teachings for use with commercially available electromagnetic design software. Such a transmission line model is illustrated in FIG. 3.

Figure 3:
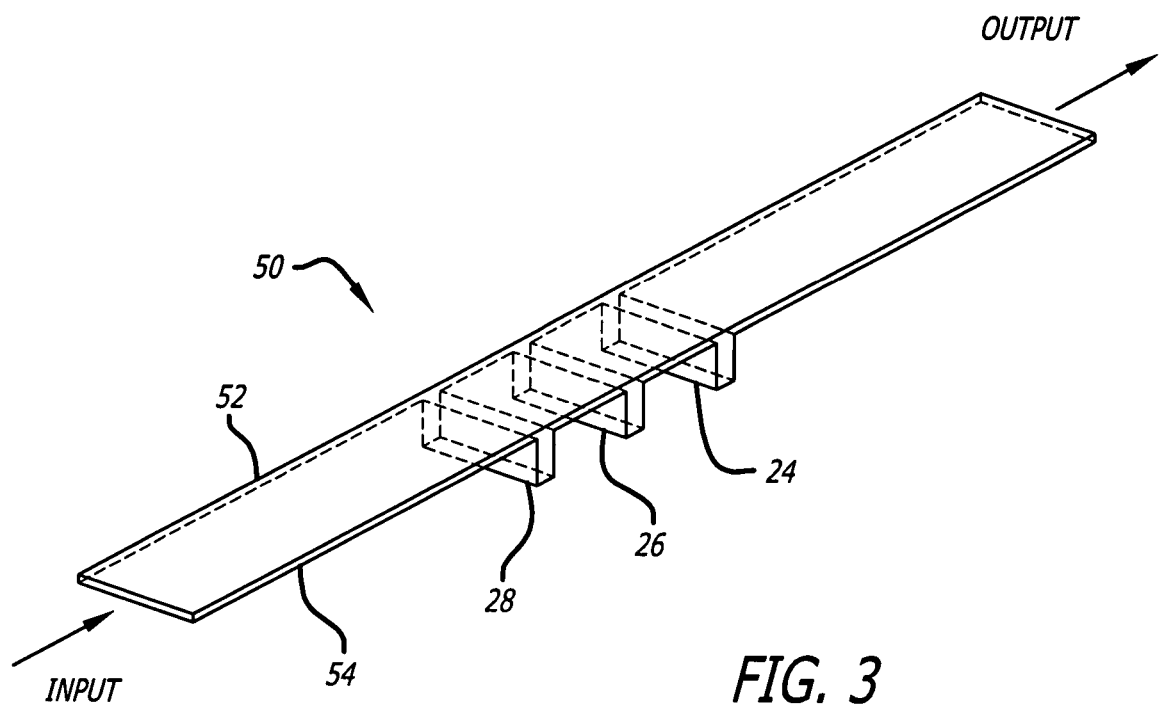
FIG. 3 is a diagram showing the parallel-plate transmission-line model used to design the electromagnetic seals shown in FIGS. 1 and 2.

FIG. 3 is a diagram showing the parallel-plate transmission-line model used to design an electromagnetic seal in accordance with an illustrative embodiment of the present teachings. The model 50 comprises the volume between two finite-width perfectly conducting parallel plates 52 and 54. The grooves comprising the electromagnetic seal are cut into the lower of the two perfectly-conducting parallel plates 54. Magnetic-wall boundary conditions are imposed along the side walls of the transmission line model in order to eliminate edge effects and to approximate propagation between two infinitely wide parallel plates.

In accordance with the present teachings, the model is used to design the electromagnetic seal, i.e., the number, placement and dimensions of the grooves thereof, so that on receipt of an input signal, a minimal, ideally zero level output is provided over the frequency range of operation thereof. That is, in the best mode, the transmission line is designed to have a transfer function approaching zero at the desired operating frequency thereof.

Such an approach was used to design the electromagnetic seals shown in FIGS. 1 and 2. The only differences between the two implementations are the radii of the first and second rotating conductive components into which the grooves are cut. The number, width, and depth of the grooves comprising the electromagnetic seals are otherwise identical.

Figure 4A:
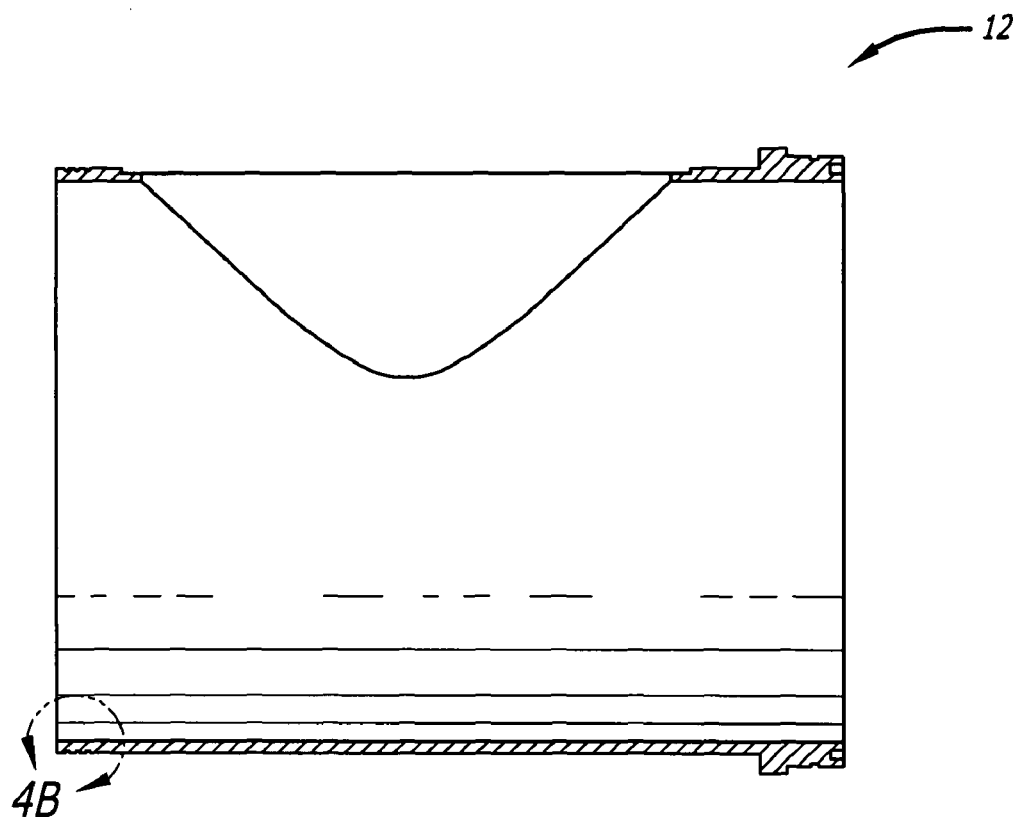
FIG. 4a is a sectional side view of the first tube 12 of FIG. 1.

FIG. 4a is a sectional side view of the first tube 12 of FIG. 1.

Figure 4B:
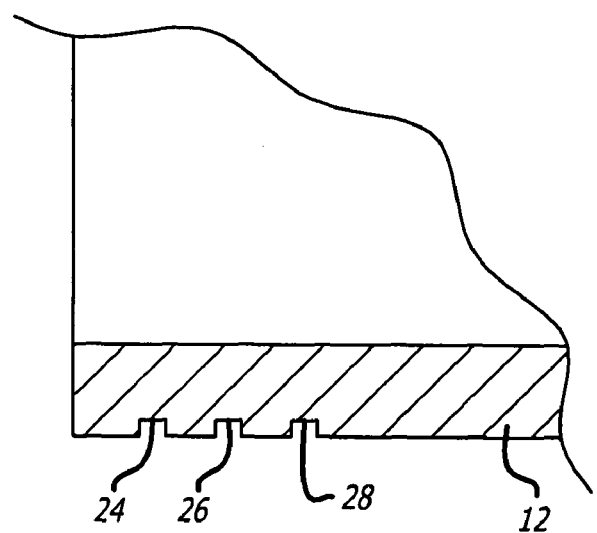
FIG. 4b is a magnified view of a portion of the tube depicted in FIG. 4a showing the electromagnetic seal grooves thereon.

FIG. 4b is a magnified view of a portion of the tube depicted in FIG. 4a showing the electromagnetic seal grooves thereon. As shown in FIGS. 4a and 4b, in the illustrative embodiment, each of the three grooves has a width of $0.1521\lambda$, a depth of $0.2817\lambda$, and a center-to-center spacing of $0.8049\lambda$, where $\lambda$ is the wavelength at the desired operating frequency. In the illustrative embodiment, the operating frequency is 95 GHz and λ is therefore equal to 0.12424 in.

To ensure that curvature of the conductors does not have a serious effect on seal performance, the parallel-plate transmission-line model described above is modified below to include the curvature of the conductors. This model is shown in FIG. 5.

Figure 5:
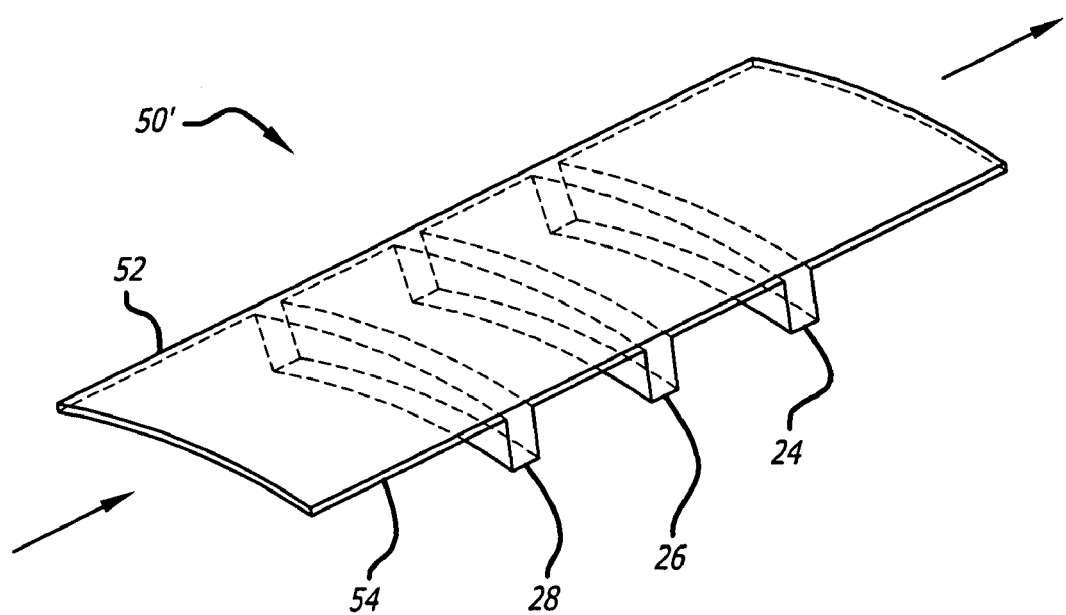
FIG. 5 is a diagram showing a model of the electromagnetic seal per FIG. 3 modified to incorporate a curvature of the conductors thereof to calculate its electrical performance in accordance with the present teachings.

FIG. 5 is a diagram showing a model of the electromagnetic seal per FIG. 3 modified to incorporate a curvature of the conductors thereof to calculate its electrical performance in accordance with the present teachings. The electromagnetic field propagating through the truncated gap is a superposition of the fundamental eigenmodes of the waveguide formed by the two (perfectly conducting) electric-walls and two magnetic-wall boundaries. The insertion losses for the first three eigenmodes of the waveguide are plotted as functions of frequency in FIG. 6.

Figure 6:
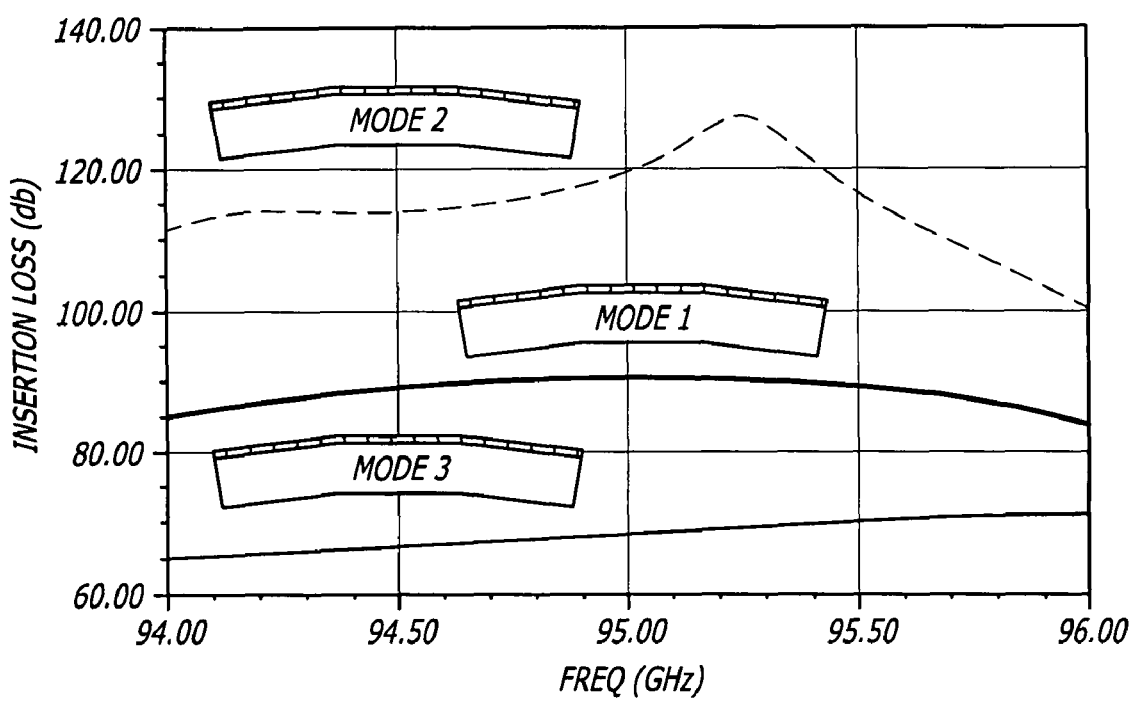
FIG. 6 is a plot of the insertion loss calculated using the truncated model shown in FIG. 5.

FIG. 6 is a plot of the insertion loss calculated using the truncated model shown in FIG. 5. The three curves represent the calculated insertion loss in a conventional manner for the first three modes of the transmission line represented by the gap between the inner and outer conductors in accordance with the present teachings. Also shown are the transverse field profiles of the eigenmodes themselves.

The first eigenmode has an electric field that is constant in amplitude across the waveguide. This eigenmode represents the fundamental transverse electromagnetic mode that propagates in the coaxial transmission line whose interior conductor is the exterior of the conductive cylindrical component and whose outer conductor is the housing. The $2^{nd}$ and $3^{rd}$ eigenmodes actually represent very high order eigenmodes of the complete coaxial transmission line, as it is clear that the number of nodes in the electric field would be very high were the fields shown in FIG. 6 to be extrapolated to generate the fields filling the complete annular cross section of the transmission line. That a minimum attenuation in excess of 60 dB may be achieved for the fundamental mode and two high-order modes is a good indicator that the electromagnetic seal will function as intended regardless of the configuration of the incident electromagnetic field.

Thus, the present invention has been described herein with reference, to a particular embodiment for a particular application. Those having ordinary skill in the art and access to the present teachings will recognize additional modifications, applications, and embodiments within the scope thereof. For example, the groove or grooves used to seat one or more standard environmental seals can be cut into the exterior of the conductive cylindrical component without departing from the scope of the present teachings. In addition, while the illustrative embodiment shows three uniformly spaced grooves each having common width and depth, those skilled in the art will appreciate that an electromagnetic seal having an arbitrary number of non-uniform grooves having non-uniform spacing can be implemented without departing from the scope of the present teachings. Further, those skilled in the art will further appreciate that the grooves providing the electromagnetic seal can be cut into the conductive fitting instead of the associated rotary tube without departing from the scope of the present teachings.

It is therefore intended by the appended claims to cover any and all such applications, modifications and embodiments within the scope of the present invention.

Accordingly,

What is claimed is:

1. A combined environmental-electromagnetic rotary seal comprising:
   a first conductive cylindrical component whose interior is part of an electromagnetic energy transmission system;
   a conductive housing enclosing the first conductive cylindrical component in such a way that the first conductive cylindrical component lies at least partially inside the conductive housing and can rotate freely with respect to the conductive housing;
   an electromagnetic seal comprising a set of circumferential grooves cut into either the exterior of the first conductive cylindrical component or into the interior surface of the conductive housing, the grooves being located between the points at which the first conductive component enters and leaves the conductive housing; and
   an environmental seal comprising one or more grooves cut into either the exterior of the first conductive cylindrical component or the interior surface of the conductive housing, the grooves being located between points at which the first conductive component enters and leaves the conductive housing and a non-conductive seal such as an elastomeric o-ring.

2. The invention of 1 wherein the environmental seal is axially positioned between the electromagnetic seal and an exterior environment from which contamination is to be prevented.

3. The invention of 1 wherein the grooves comprising the electromagnetic seal vary in width, depth, and/or separation.

4. The invention of 1 wherein the first conductive cylindrical component and the conductive housing are electrically insulated and can be maintained at different electrical potentials.

5. The invention of 1 wherein the electromagnetic energy transmission system enclosed by the first conductive cylindrical component is a beam waveguide transmission system.

6. The invention of 1 wherein the electromagnetic energy transmission system enclosed by the first conductive cylindrical component is a circular waveguide transmission system.

7. The invention of 1 wherein the electromagnetic energy transmission system enclosed by the first conductive cylindrical component is a coaxial transmission line transmission system.

* * * * *